(12) United States Patent
Choi et al.

(10) Patent No.: US 9,715,997 B2
(45) Date of Patent: Jul. 25, 2017

(54) SPUTTERING APPARATUS AND METHOD (71) Applicant: Samsung Display Co., Ltd., Yongin (KR)

(72) Inventors: Seung-Ho Choi, Yongin (KR); Dae-Sang Yoon, Yongin (KR); Young-Bun Jeon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 409 days.

(21) Appl. No.: 14/226,564

(22) Filed: Mar. 26, 2014

(65) Prior Publication Data
US 2015/0041310 A1  Feb. 12, 2015

(30) Foreign Application Priority Data

Aug. 6, 2013 (KR) .......................... 10-2013-0093337

(51) Int. Cl.
C23C 14/34 (2006.01)
H01J 37/34 (2006.01)

(52) U.S. Cl.
CPC ...... *H01J 37/3417* (2013.01); *C23C 14/3464* (2013.01); *C23C 14/3492* (2013.01); *H01J 37/342* (2013.01); *H01J 37/3464* (2013.01)

(58) Field of Classification Search
CPC ............. C23C 14/3464; C23C 14/3492; H01J 37/3417; H01J 37/342
See application file for complete search history.

(56) References Cited

U.S. PATENT DOCUMENTS

| | | | | |
|---|---|---|---|---|
| 4,828,668 A | * | 5/1989 | Yamazaki | C23C 14/56 204/192.12 |
| 6,974,976 B2 | * | 12/2005 | Hollars | C23C 14/0057 136/264 |
| 2008/0264785 A1 | * | 10/2008 | De Bosscher | H01J 37/3405 204/298.15 |
| 2010/0072061 A1 | | 3/2010 | Morohashi | |
| 2011/0168553 A1 | | 7/2011 | Choi et al. | |

FOREIGN PATENT DOCUMENTS

| | | |
|---|---|---|
| JP | 2006-202417 | 8/2006 |
| KR | 10-2009-0084808 | 8/2009 |
| KR | 10-2011-0082320 | 7/2011 |

OTHER PUBLICATIONS

Yusuke Onai, et al., "Transparent conductive film for top-emission organic light-emitting devices by low damage facing target sputtering," Thin Solid Films, Elsevier, vol. 516, Jul. 2008, pp. 5911-5915.

* cited by examiner

*Primary Examiner* — Jason M Berman
(74) *Attorney, Agent, or Firm* — H.C. Park & Associates, PLC (57) ABSTRACT

A sputtering apparatus includes: a first cylindrical target unit, a second cylindrical target unit facing the first cylindrical target unit; a third cylindrical target unit facing the first cylindrical target unit and the second cylindrical target unit; a fourth cylindrical target unit facing the first cylindrical target unit, the second cylindrical target unit, and the third cylindrical target unit; and a power unit configured to provide power such that two of the first cylindrical target unit, the second cylindrical target unit, the third cylindrical target unit, and the fourth cylindrical target unit function as different electrodes.

5 Claims, 7 Drawing Sheets

SPUTTERING APPARATUS AND METHOD

CROSS-REFERENCE TO RELATED APPLICATION

This application claims priority from and the benefit of Korean Patent Application No. 10-2013-0093337, filed on Aug. 6, 2013, which is incorporated by reference for all purposes as if set forth herein.

BACKGROUND

Field

Exemplary embodiments relate to manufacturing technology, and, more particularly, to a sputtering apparatus and method.

Discussion

Mobile electronic devices, such as mobile phones, tablet computers, notebook computers, personal digital assistants, cameras, camcorders, and the like, are ubiquitous. Such mobile electronic devices typically include a display unit to support various functions and provide visual information, such as an image or a video, to a user. As components for operating the display unit are miniaturized, the complexity of the display unit in an electronic device, whether or not mobile, increases. It is also noted that as curved displays become more in vogue, manufacturing techniques to fabricate such curved displays with increasingly smaller operating components are needed.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a sputtering apparatus and method to minimize (or otherwise reduce) damage to a substrate during a sputtering process.

Additional aspects will be set forth in the detailed description which follows, and, in part, will be apparent from the disclosure, or may be learned by practice of the inventive concept.

According to exemplary embodiments, a sputtering apparatus includes: a first cylindrical target unit; a second cylindrical target unit facing the first cylindrical target unit; a third cylindrical target unit facing the first cylindrical target unit and the second cylindrical target unit; a fourth cylindrical target unit facing the first cylindrical target unit, the second cylindrical target unit, and the third cylindrical target unit; and a power unit configured to provide power such that two of the first cylindrical target unit, the second cylindrical target unit, the third cylindrical target unit, and the fourth cylindrical target unit function as different electrodes.

According to exemplary embodiments, a sputtering method includes: providing power to at least one pair of a plurality of pairs of cylindrical target units, each of the cylindrical target units being spaced apart from one another and arranged facing one another; and providing a sputtering gas in a region between the plurality of pairs of cylindrical target units, wherein the provision of power causes, at least in part, each pair of cylindrical target units to comprise a first cylindrical target unit functioning as an anode electrode and a second cylindrical target unit functioning as a cathode electrode.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
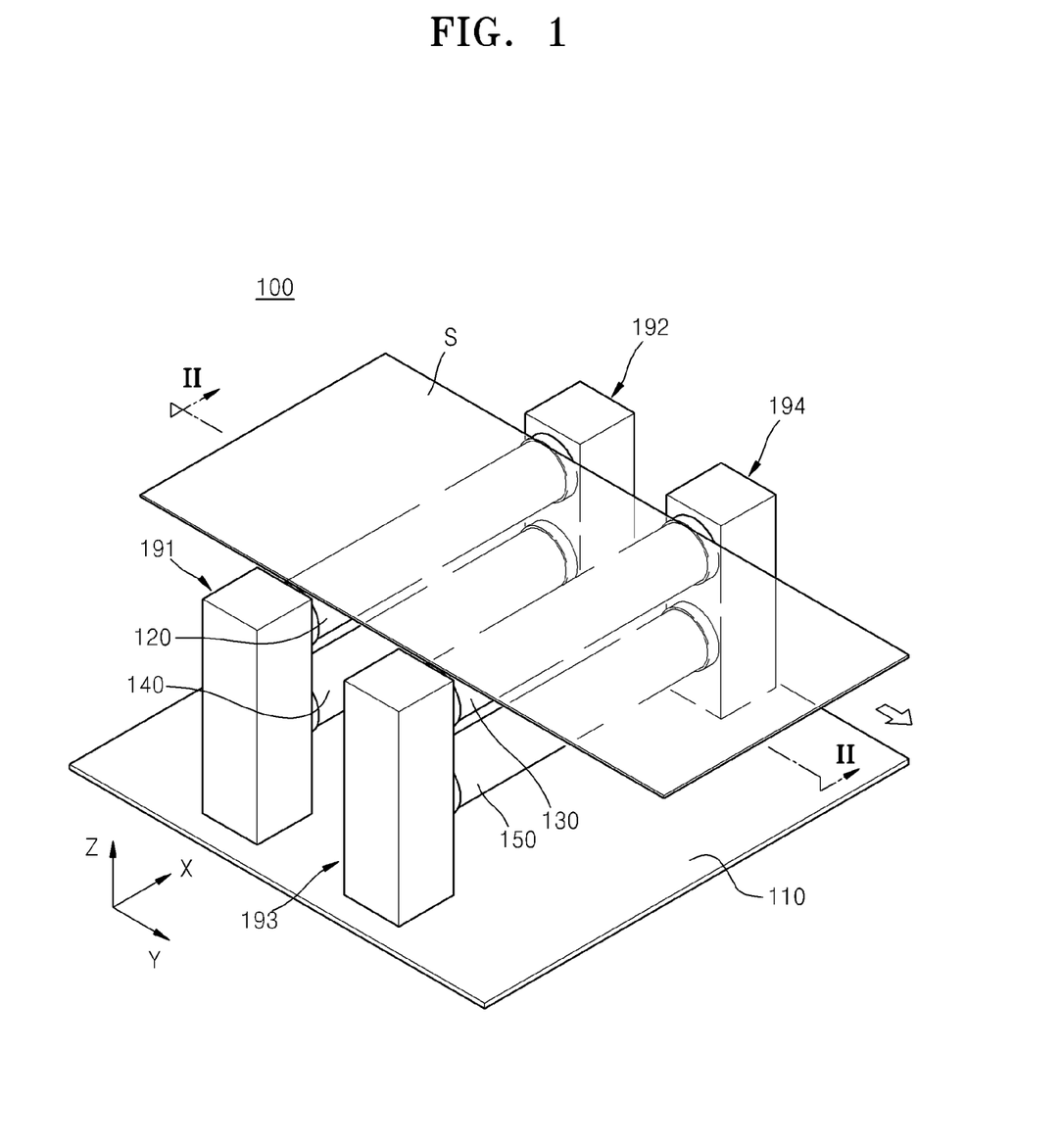
FIG. 1 is a perspective view of a sputtering apparatus, according to exemplary embodiments.
Figure 2:
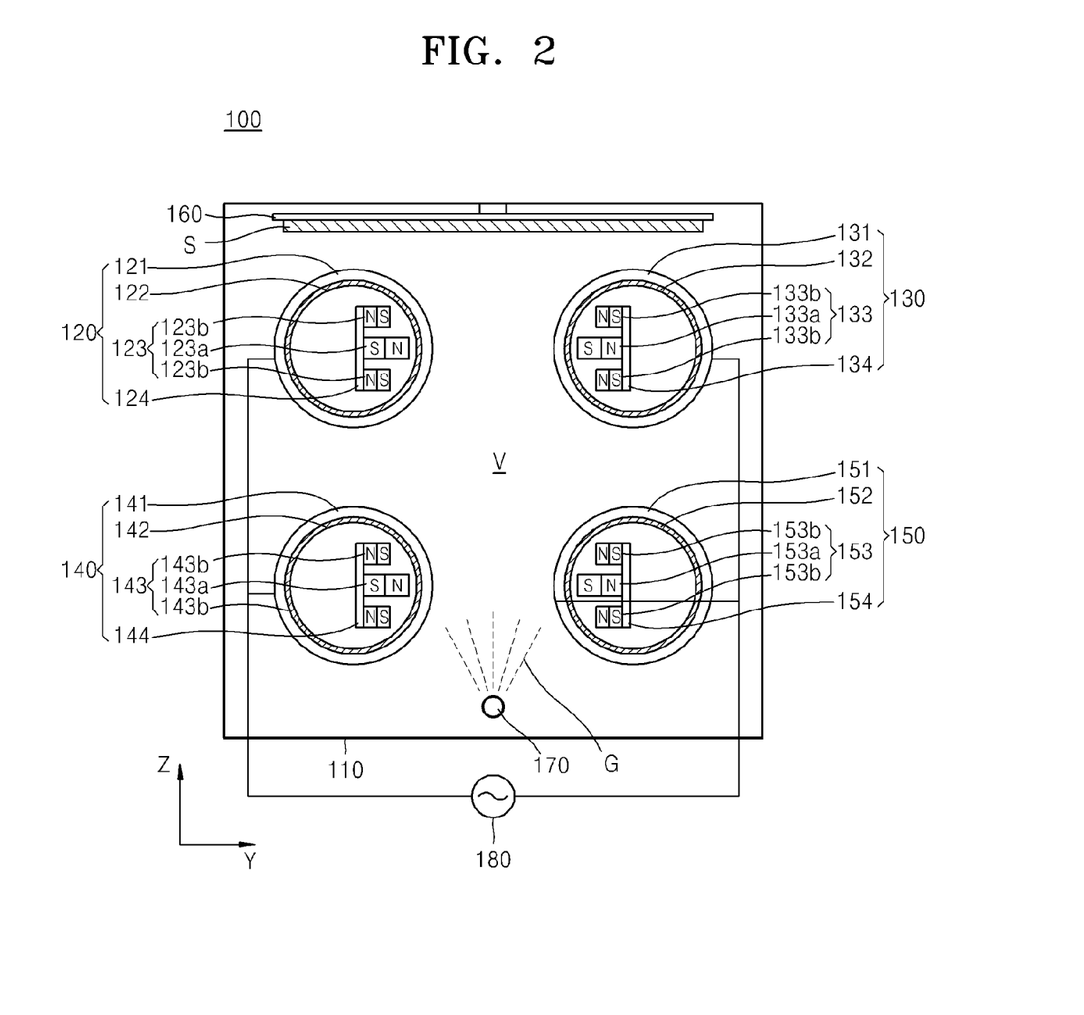
FIG. 2 is a cross-sectional view of the sputtering apparatus of FIG. 1 taken along sectional line II-II, according to exemplary embodiments.

FIG. 1 is a perspective view of a sputtering apparatus, according to exemplary embodiments. FIG. 2 is a cross-sectional view of the sputtering apparatus of FIG. 1 taken along sectional line II-II.

Referring to FIGS. 1 and 2, a sputtering apparatus 100 may include a chamber 110 including a deposition space in which a substrate (S) is disposed and a deposition process for the substrate S may be performed. The sputtering apparatus 100 may further include a first cylindrical target unit 120 and a second cylindrical target unit 130, which may be disposed to face the substrate S in the chamber 110. The sputtering apparatus 100 may also include a third cylindrical target unit 140 that may be disposed to face the first cylindrical target unit 120 and the second cylindrical target unit 130, and a fourth cylindrical target unit 150 that may be disposed to face the first to third cylindrical target units 120-140. Although the first to fourth cylindrical target units 120-140 are illustrated and described herein as being cylindrical, it is contemplated that any other suitable geometric configuration may be utilized. To this end, any suitable number of target units may be utilized.

According to exemplary embodiments, the sputtering apparatus 100 may also include a power unit 180 configured to provide power to the first to fourth cylindrical target units 120, 130, 140, and 150. The sputtering apparatus 100 may also include a gas supply unit 170 configured to supply one or more process gases to effectuate a sputtering process in a space defined by the first to fourth cylindrical target units 120, 130, 140, and 150.

The sputtering apparatus 100 may also include one or more support units (e.g., support units 191, 192, 193, and 194), which may be respectively installed (e.g., coupled) at respective ends of the first to fourth cylindrical target units 120, 130, 140, and 150. The support unit(s) may individually support both ends of each of the first to fourth cylindrical target units 120, 130, 140, and 150. It is also contemplated that the support unit(s) may support both ends of two or more of the first to fourth cylindrical target units 120, 130, 140, and 150. For illustrative and descriptive purposes, exemplary embodiments are described herein with reference to a support unit configured to supports both ends of two of the first to fourth cylindrical target units 120, 130, 140, and 150.

As seen in FIG. 1, the support unit includes a first support unit 191, a second support unit 192, a third support unit 193, and a fourth support unit 194. The first and second support units 191 and 192 are configured to support first ends and second ends, respectively, of the first and third cylindrical target units 120 and 140. The third and fourth support units 193 and a fourth support unit 194 are configured to support first ends and second ends, respectively, of the second and fourth cylindrical target units 130 and 150.

Although not illustrated, the chamber 110 may be connected to a pump, which may be utilized to control the pressurization of the atmosphere in the chamber 110, such as control the pressurization of the atmosphere during a deposition process. The chamber 110, as well as the control of the pressurization of the atmosphere therein, may protect the substrate (S), the first to fourth cylindrical target units 120, 130, 140, and 150, and the like. The chamber 110 may also be provided with at least one inlet and/or outlet (not illustrated) to enable the substrate S to be loaded and/or unloaded. Although FIG. 1 only illustrates a bottom of the chamber 110, this is merely for illustrative convenience. The chamber 110 may be geometrically configured similar to a box or any other suitable housing configuration.

In exemplary embodiments, the substrate S may be disposed on a fifth support unit 160. The fifth support unit 160 may prevent the substrate S from moving or shaking while a deposition process is performed. As such, the fifth support unit 160 may be provided with a clamp (not illustrated). It is also contemplated that the orientation and/or spatial positioning of the fifth support unit 160 may be controlled, such as controlled during a deposition process. For instance, one or more actuators (not shown) may be utilized to control the spatial position of the fifth support unit 160 in one or more Cartesian directions and/or control one or more of the pitch, roll, and yaw of the fifth support unit 160. To facilitate adsorption between the fifth support unit 160 and the substrate S, the fifth support unit 160 may also include at least one adsorption hole (not illustrated). Further, the fifth support unit 160 may be formed of any suitable material, such as a material having high heat resistance and high durability to prevent (or otherwise reduce) degeneration and fracture of the fifth support unit 160, which may otherwise result from the heat and atmospheric conditions utilized during the deposition process.

As seen in FIGS. 1 and 2, the first to fourth cylindrical target units 120, 130, 140, and 150 may be arranged in the shape of a rectangle, e.g., arranged at vertices of an imaginary rectangle. That is, the first and third cylindrical target units 120 and 140 may be disposed in a first diagonal line direction, and the second and fourth cylindrical target units 130 and 150 may be disposed in a second diagonal line direction crossing the first diagonal line direction. The first and second cylindrical target units 120 and 130 may be disposed in the same first imaginary plane, and the third and fourth cylindrical target units 140 and 150 may be disposed in the same second imaginary plane. To this end, the first and third cylindrical target units 120 and 140 may be disposed in the same third imaginary plane crossing the first and second imaginary planes, and the second and fourth cylindrical target units 130 and 150 may be disposed in the same fourth imaginary plane crossing the first and second imaginary planes. Further, the first cylindrical target unit 120 may be spaced apart from the third cylindrical target unit 140 in a Z-axis direction and spaced apart from the second cylindrical target unit in a Y-axis direction. The fourth cylindrical target unit 140 may be spaced apart from the third cylindrical target unit 140 in the Y-axis direction and spaced apart from the second cylindrical target unit 130 in the Z-axis direction.

It is contemplated, however, that exemplary embodiments are not limited to the above-described embodiment/configuration. In this manner, any suitable configuration in which the first to fourth cylindrical target units 120, 130, 140, and 150 face one another may be utilized. Also, for convenience of description, exemplary embodiments described herein reference a configuration in which the first and third cylindrical target units 120 and 140 are spaced apart from each other in the Z-axis direction, and the first and second cylindrical target units 120 and 130 are spaced apart from each other in a Y-axis direction. To this end, the first to fourth cylindrical target units 120, 130, 140, and 150 may be configured substantially similar to each other, and, as such, an exemplary configuration of the first cylindrical target unit 120 is provided to avoid obscuring exemplary embodiments.

According to exemplary embodiments, the first cylindrical target unit 120 may include a first cylindrical target 121 disposed to face the substrate S. The first cylindrical target 121 is configured to provide a deposition material to the substrate S to allow a deposition film to be formed on the substrate S while rotating during a deposition process. In this manner, the first cylindrical target 121 may have an axis of rotation extending in the X-axis direction. It is noted that the length of the first cylindrical target 121 in the X-axis direction may be at least the same as or greater than the width of the substrate S in the X-axis direction.

As seen in FIG. 2, the first cylindrical target unit 120 may include a first backing plate 122 on which the first cylindrical target 121 is disposed. As such, the first cylindrical target 121 may be supported by the first backing plate 122. The first backing plate 122 has a similar shape as the first cylindrical target 121. That is, each of the first cylindrical target 121 and the first backing plate 122 may have a hollow cylindrical shape, such that the first cylindrical target 121 is substantially concentric about the first backing plate 122. The first backing plate 122 may also be configured to maintain (or otherwise control) the temperature of the first cylindrical target 121 during, for example, the deposition process. As such, the first cylindrical target 121 may be provided with power from the power unit 180. For example, the first backing plate 122 may be provided with alternating current (AC) power, and, as such, may function as a cathode or an anode. Through this operation, the first cylindrical target 121 may be connected to the first backing plate 122, and, thereby, may function as an anode or cathode. It is contemplated, however, that the first cylindrical target 121 may be used without the first backing plate 122. As such, the power unit 180 may provide power to the first cylindrical target 121 to, for example, maintain (or control) a temperature of the first cylindrical target 121.

According to exemplary embodiments, a first magnet unit 123 may be disposed in the first cylindrical target 121, e.g., in the hollow region of the first cylindrical target 121. The first magnet unit 123 may have a shape longitudinally extending in a lengthwise direction of the first cylindrical target 121. That is, the first magnet unit 123 and the first cylindrical target 121 may longitudinally extend in the X-axis direction. It is noted, however, that the first magnet unit 123 may be configured to not rotate with first cylindrical target 121 during the deposition process. In this manner, the first magnet unit 123 is not connected to the first cylindrical target 121 or the first backing plate 122. As such, the first magnet unit 123 may be installed on (e.g., coupled to) a first magnet fixing frame 124. The first magnet fixing frame 124 is not connected to the first cylindrical target 121 or the first backing plate 122, however, may be coupled to the first and second support units 191 and 192 or rotatably coupled thereto. The rotation of the first magnet unit 123 may be controlled separately from the rotation of the first cylindrical target 121.

In exemplary embodiments, the first magnet unit 123 is configured to generate a magnetic field to control plasma discharge. For example, the first magnet unit 123 may include a first magnet member 123a and a pair of second magnet members 123b, which may be disposed at either longitudinal sides of the first magnet member 123a. The first magnet member 123a and the pair of second magnet members 123b may be disposed with opposite polarities and may be controlled such that the magnetic field generated by the first magnet unit 123 may be focused on a portion of the first cylindrical target 121. As such, plasma discharge may also be focused on the portion of the first cylindrical target 121.

Although not illustrated, the first support unit 191 may include a first drive shaft, a first drive unit, a first housing, a first cooling water inlet pipe, and a first cooling water outlet pipe. The first backing plate 122 and the first cylindrical target 121 may be rotated by the first drive shaft. That is, the first drive shaft may be connected to the first drive unit, such as a drive belt or the like, to receive a drive force that rotates the first backing plate 122 and the first cylindrical target 121. The power unit 180 may be connected to the first drive shaft, and may power rotation of the first backing plate 122 via the first drive shaft.

The first drive shaft may longitudinally extend to both ends of the first backing plate 122, and may be received by the first housing. The first backing plate 122 and the first drive shaft may also be connected and fixed by a first backing tube (not illustrated). However, exemplary embodiments are not limited thereto, and the first backing tube may be omitted and the first backing plate 122 and the first drive shaft may be formed integrally.

In exemplary embodiments, the first housing may be formed with the first cooling water inlet pipe and the first cooling water outlet pipe. The first cooling water inlet pipe and the first cooling water outlet pipe may be connected to an inside portion of the first cylindrical target 121 to circulate cooling water. In this manner, heat generated in the first cylindrical target 121 during the sputtering process may be absorbed into the circulating cooling water through the first backing plate 122 so that the temperature of the first cylindrical target 121 may be controlled, such as maintained. By doing so, the efficiency of the sputtering process may be enhanced.

When the first support unit 191 is configured as described, the second support unit may rotatably support the first cylindrical target unit 120. The third support unit 193 may be formed similarly to the first support unit 191, and the fourth support unit 194 may be formed similarly to the second support unit 192.

As previously mentioned, the second to fourth cylindrical target units 130-150 may be formed substantially similar to the first cylindrical target unit 120. For example, the second cylindrical target unit 130 may include a second cylindrical target 131, a second backing plate 132, a second magnet unit 133, and a second magnet fixing frame 134. The second magnet unit 133 may include a third magnet member 133*a* and a pair of fourth magnet members 133*b*. The third cylindrical target unit 140 may include a third cylindrical target 141, a third backing plate 142, a third magnet unit 143, and a third magnet fixing frame 144. The third magnet unit 143 may include a fifth magnet member 143*a* and a pair of sixth magnet members 133*b*. Also, the fourth cylindrical target unit 150 may include a fourth cylindrical target 151, a fourth backing plate 152, a fourth magnet unit 153, and a fourth magnet fixing frame 154. To this end, the fourth magnet unit 153 may include a seventh magnet member 153*a* and a pair of eighth magnet members 153*b*.

According to exemplary embodiments, the gas supply unit 170 may be formed to penetrate (or otherwise extend into) the chamber 110. The gas supply unit 170 may supply a process gas G used in the sputtering process to a space V disposed between the first to fourth cylindrical target units 120, 130, 140, and 150. Also, the gas supply unit 170 may be configured such that an inlet/outlet of the process gas G faces the substrate S, and may be disposed between the third and fourth cylindrical target units 140 and 150 to supply the process gas G to a region between the third and fourth cylindrical target units 140 and 150. It is contemplated, however, that the process gas G may be provided to effectuate the sputtering process in any other suitable manner.

In exemplary embodiments, the sputtering apparatus 100 may maintain the substrate S and the chamber 110 in an electrically floated state. As such, if the substrate S and the chamber 110 are maintained in the electrically floated state, then when anions, electrons, and the like (which are generated due to the generation of plasma travel toward an anode) bombard the substrate S (which deviates from a traveling path of the anions, electron, and the like), damage to the substrate S due to the bombarding anions, electrons, and the like, may be prevented, as may be the generation of an arc. Also, as the substrate S maintains the electrically floated state, although a distance between the first to fourth cylindrical target units 120, 130, 140, and 150 and the substrate S may be decreased, damage to the substrate S may be prevented, which may increase the rate of deposition and enhance the efficiency of the deposition process.

Exemplary operation and effect of the sputtering apparatus 100 will be described in association with FIGS. 1 and 2.

The substrate S may be disposed in the chamber 110 of the sputtering apparatus 100. The first and second cylindrical target units 120 and 130, which may provide a material to form a deposition film on the substrate S, are disposed to face the substrate S. The substrate S may be arranged (e.g., linearly move in the Y-axis direction) in a state that the substrate S faces the first and second cylindrical target units 120 and 130. The substrate S may move in the Y-axis direction by a scan method. The process gas G is injected into the chamber 110 through the gas supply unit 170. The injected gas forms plasma and excited particles collide with the first to fourth cylindrical target units 120, 130, 140, and 150, such that particles emitted from the first to fourth cylindrical target units 120, 130, 140, and 150 arrive on the substrate S to form a deposition film.

The deposition process may be performed while each of the first to fourth cylindrical target units 120, 130, 140, and 150 rotate about respective axes of rotation longitudinally extending in the X-axis direction. In this manner, the whole surfaces of the first to fourth cylindrical target units 120, 130, 140, and 150 may be more uniformly used to perform the deposition process. This enhances the use efficiency of the first to fourth cylindrical target units 120, 130, 140, and 150, increases the use period of the first to fourth cylindrical target units 120, 130, 140, and 150, and more efficiently performs the deposition process using the sputtering apparatus 100.

In exemplary embodiments, the first to fourth magnet units 123, 133, 143, and 153 are respectively provided in the first to fourth cylindrical target units 120, 130, 140, and 150, which may enhance the deposition efficiency to the substrate S. That is, the first to fourth cylindrical target units 120, 130, 140, and 150 may be disposed as previously described and receive power from the power unit 180. In this manner, the first to fourth cylindrical target units 120, 130, 140, and 150 may function as an anode or cathode. For example, when power is provided to each of the first to fourth cylindrical target units 120, 130, 140, and 150, the first and third cylindrical target units 120 and 140 may function as an anode and the second and fourth cylindrical target units 130 and 150 may function as a cathode.

The polarity of the first magnet unit 123 disposed in the first cylindrical target unit 120 may be the same as or different from the polarity of the second magnet unit 133 disposed in the second cylindrical target unit 130. That is, the first magnet member 123*a* and the third magnet member 133*a* may have the same polarity or different polarities from each other, and the pair of second magnet members 123*b* and the pair of fourth magnet members 133*b* may have the same polarity or different polarities from each other. For example, when a first portion of the first magnet member 123*a* disposed on the first magnet fixing frame 124 has the polarity of N, a second portion of the first magnet member 123*a* disposed on the first portion of the first magnet member 123a may have the polarity of S. To this end, a first portion of the second magnet member 133a disposed on the second magnet fixing frame 134 may have the polarity of N or S, and a second portion of the third magnet member 133a disposed on the first portion of the third magnet member 133a may have the polarity of S or N. Further, when respective first portions of the second magnet members 123b disposed on the first magnet fixing frame 124 have the polarity of N, respective second portions of the pair of second magnet members 123b correspondingly disposed on the respective first portions of the pair of second magnet members 123b may have the polarity of S. In this manner, respective first portions of the pair of fourth magnet members 133b disposed on the second magnet fixing frame 134 may have the polarity of N or S, and respective second portions of the pair of the fourth magnet members 133b correspondingly disposed on the respective first portions of the pair of fourth magnet members 134b may have the polarity of S or N.

For convenience of description, exemplary embodiments are described below with reference to the case where as the polarity of the first magnet member 123a, an outer portion of the first cylindrical target unit 120 has the polarity of N and an inner portion of the first cylindrical target unit 120 has the polarity of S, and as the polarity of the pair of second magnet members 123b, the respective outer portions of the first cylindrical target unit 120 have the polarity of S and the respective inner portions of the first cylindrical target unit 120 have the polarity of N. To this end, exemplary embodiments are below with reference to the case where as the polarity of the third magnet member 133a, an outer portion of the second cylindrical target unit 130 has the polarity of S and an inner portion of the second cylindrical target unit 130 has the polarity of N, and as the polarity of the pair of fourth magnet members 133b, respective outer portions of the second cylindrical target unit 130 have the polarity of N and the respective inner portions of the second cylindrical target unit 130 have the polarity of S.

In exemplary embodiments, the polarity configurations of the third and fourth magnet units 143 and 143 are respectively similar to the polarity configurations of the first and second magnet units 123 and 133. As such, the polarities of the fifth to eighth magnet members 143a, 143b, 153a, and 153b may be correspondingly the same as the polarities of the first to fourth magnet members 123a, 123b, 133a, and 133b. To avoid obscuring exemplary embodiments described herein, duplicative descriptions are omitted.

When the first to eighth magnet members 123a, 123b, 133a, 133b, 143a, 143b, 153a, and 153b are configured as described above, a magnetic field formed by the first to eighth magnet members 123a, 123b, 133a, 133b, 143a, 143b, 153a, and 153b may confine plasma in a space V disposed between the first to fourth cylindrical target units 120, 130, 140, and 150. In this manner, when the process gas G is injected into the space V, plasma may be generated from the first to fourth cylindrical target units 120, 130, 140, and 150 by the process gas G. The plasma may be diffused by the process gas G supplied from the gas supply unit 170, and, thereby, deposited on the substrate S.

According to exemplary embodiments, since the generated plasma may be confined in the space V between the first to fourth cylindrical target units 120, 130, 140, and 150 by the magnetic field formed by the first to fourth cylindrical target units 120, 130, 140, and 150, the plasma may arrive at the substrate S in a relatively low energy state. That is, since the substrate S and the chamber 110 may be maintained in an electrically floated state, the plasma may be prevented from being accelerated and directly deposited on the substrate S in a relatively high energy state. As such, the sputtering apparatus 100 may minimize (or otherwise reduce) damage of the substrate S that may otherwise occur due to accelerated plasma being deposited on the substrate S in a relatively high energy state.

Additionally, the sputtering apparatus 100 may increase the space use rate of the interior region of the chamber 110 by using the first to fourth cylindrical target units 120, 130, 140, and 150 having the cylindrical shape. Further, since electric fields and magnetic fields are generated in the same direction in the first and second cylindrical target units 120 and 130 facing each other, and in the same direction in the third and fourth cylindrical target units 140 and 150 facing each other, the sputtering apparatus 100 may prevent discharge efficiency reduction that may otherwise occur when the electric field and the magnetic field are in different directions.

Figure 3:
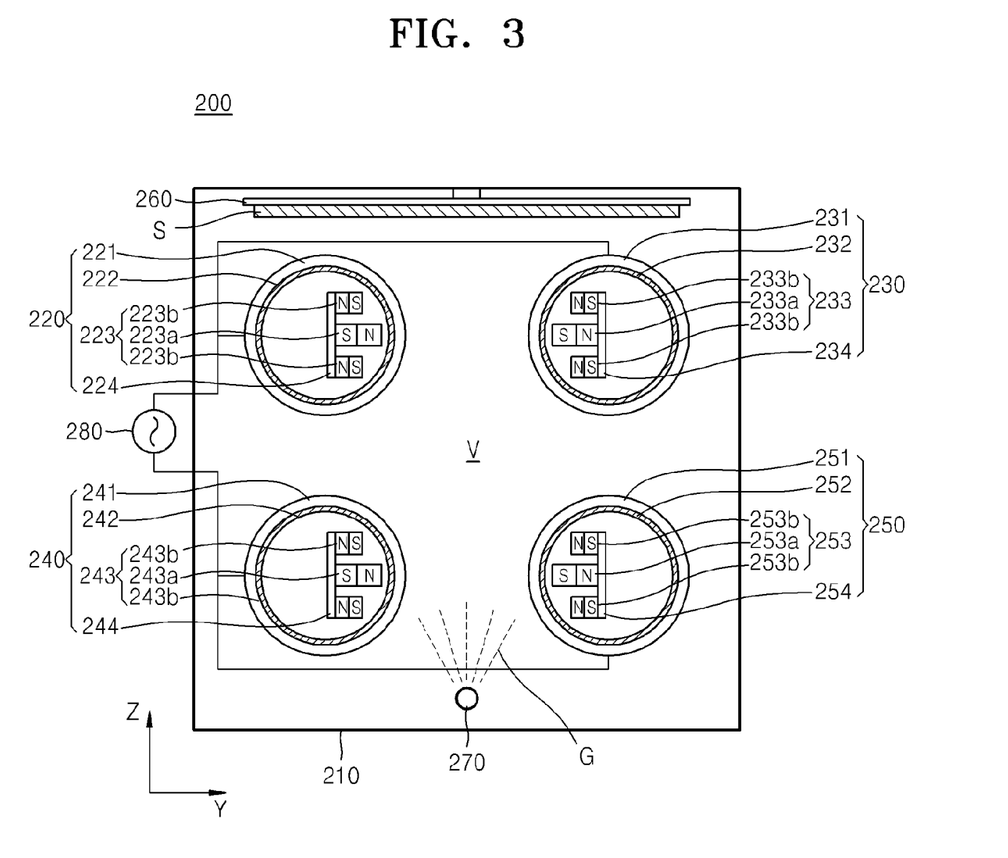
FIG. 3 is a cross-sectional view of a sputtering apparatus, according to exemplary embodiments.
Figure 4:
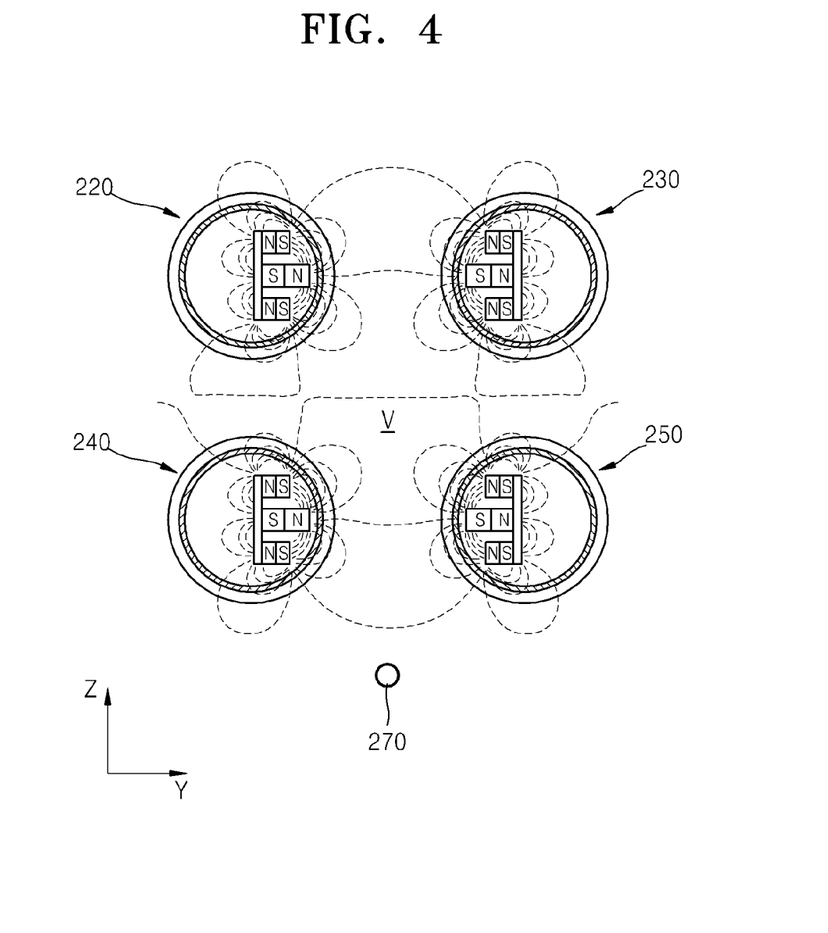
FIG. 4 is a cross-sectional view schematically illustrating a magnetic flux distribution in the sputtering apparatus of FIG. 3, according to exemplary embodiments.

FIG. 3 is a perspective view of a sputtering apparatus, according to exemplary embodiments. FIG. 4 is a cross-sectional view schematically illustrating a magnetic flux distribution in the sputtering apparatus of FIG. 3.

Referring to FIGS. 3 and 4, a sputtering apparatus 200 may include a chamber 210, a first cylindrical target unit 220, a second cylindrical target unit 230, a third cylindrical target unit 240, a fourth cylindrical target unit 250, a gas supply unit 270, and a power unit 280.

The first cylindrical target unit 220 may include a first cylindrical target 221, a first backing plate 222, a first magnet unit 223, and a first magnet fixing frame 224. The first magnet unit 223 may include a first magnet member 223a and a pair of second magnet members 223b. The second cylindrical target unit 230 may include a second cylindrical target 231, a second backing plate 232, a second magnet unit 233, and a second magnet fixing frame 234. The second magnet unit 233 may include a third magnet member 233a and a pair of fourth magnet members 233b.

The third cylindrical target unit 240 may include a third cylindrical target 241, a third backing plate 242, a third magnet unit 243, and a third magnet fixing frame 244. The third magnet unit 243 may include a fifth magnet member 243a and a pair of sixth magnet members 243b. The fourth cylindrical target unit 250 may include a fourth cylindrical target 251, a fourth backing plate 252, a fourth magnet unit 253, and a fourth magnet fixing frame 254. The fourth magnet unit 253 may include a seventh magnet member 253a and a pair of eighth magnet members 253b.

The respective configurations of the chamber 210, the first cylindrical target unit 220, the second cylindrical target unit 240, the third cylindrical target unit 250, the fourth cylindrical target unit 250, the gas supply unit 270, and the power unit 280 are substantially similar to the respective configurations of the chamber 110, the first cylindrical target unit 120, the second cylindrical target unit 130, the third cylindrical target unit 140, the fourth cylindrical target unit 150, the gas supply unit 170, and the power unit 180. As such, duplicative descriptions are omitted to avoid obscuring exemplary embodiments described herein.

In operation of the sputtering apparatus 200, a sputtering process may be performed after a substrate S is loaded into the chamber 210. In this manner, the substrate S may be disposed to face the first and second cylindrical target units 220 and 230.

When the loading of the substrate S is complete, the power unit 280 may apply power to the first to fourth cylindrical target units 220, 230, 240, and 250, such that the first to fourth cylindrical target units 220, 230, 240, and 250 may function as an anode or a cathode. That is, when power is provided to each of the first to fourth cylindrical target units 220, 230, 240, and 250, the first and second cylindrical target units 220 and 230 may function as a cathode, and the third and fourth cylindrical target units 240 and 250 may function as an anode. Alternatively, power may be provided to the first to fourth cylindrical target units 220, 230, 240, and 250, such that the first and second cylindrical target units 220 and 230 function as an anode, and the third and fourth cylindrical target units 240 and 250 function as a cathode. It is noted that the power unit 280 may provide AC power, such that the anode/cathode configuration of the first to fourth cylindrical target units 220, 230, 240, and 250 alternates between the two aforementioned configurations.

When the power unit 280 is configured as described above, a first magnetic field formed by the first and second magnet units 223 and 233 may be substantially perpendicular to a first electric field formed by the first and third cylindrical target units 220 and 240. Furthermore, a second magnetic field formed by the third and fourth magnet units 243 and 253 may be substantially perpendicular to a second electric field formed by the second and fourth cylindrical target units 230 and 250. That is, as seen in FIG. 4, the first magnetic field and the second magnetic field may be formed in a Y-axis direction, and the first electric field and the second electric field may be formed in a Z-axis direction.

According to exemplary embodiments, while the first magnetic field, the second magnetic field, the first electric field, and the second electric field are formed as described above, the first to fourth cylindrical target units 220, 230, 240, and 250 may rotate. The gas supply unit 270 may inject the process gas G from between the third and fourth cylindrical target units 240 and 250 toward the substrate S. In this manner, the process gas G may form plasma as described above, and the formed plasma may be confined in the space V between the first to fourth cylindrical target units 220, 230, 240, and 250 by the first magnetic field, the second magnetic field, the first electric field, and the second electric field. As described above, the plasma does not directly arrive at the substrate S due to the presence of the first magnetic field, the second magnetic field, the first electric field, and the second electric field, but, instead, may arrive at the substrate S due to diffusion of the process gas G.

In exemplary embodiments, since the first magnetic field is formed substantially perpendicular to the first electric field, and the second magnetic field is formed substantially perpendicular to the second electric field, the sputtering apparatus 200 may increase discharge effects between the first and third cylindrical target units 220 and 240, and between the second and fourth cylindrical target units 230 and 250. Further, because the sputtering apparatus 200 may confine plasma in the space V between the first to fourth cylindrical target units 220, 230, 240, and 250, substrate damage that may otherwise be generated when the plasma is directly accelerated and arrives at the substrate S, may be minimized (or otherwise decreased). In other words, the plasma may arrive at the substrate S in a relatively low energy state versus a relatively high energy state.

Figure 5:
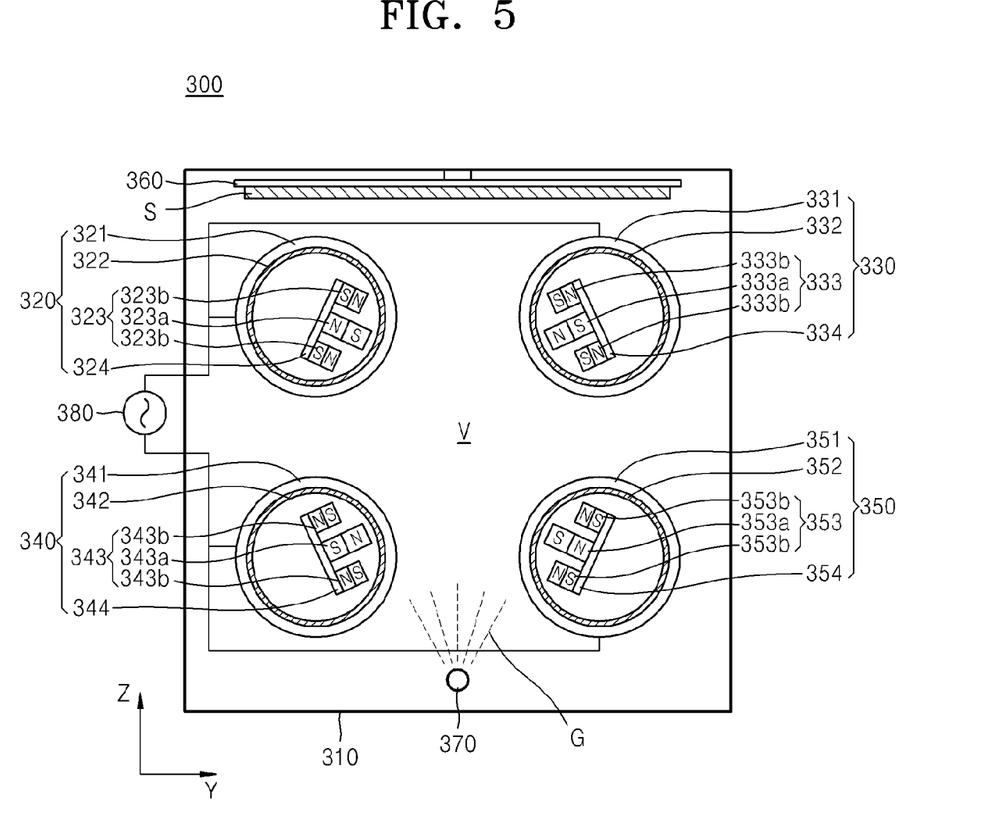
FIG. 5 is a cross-sectional view of a sputtering apparatus, according to exemplary embodiments.
Figure 6:
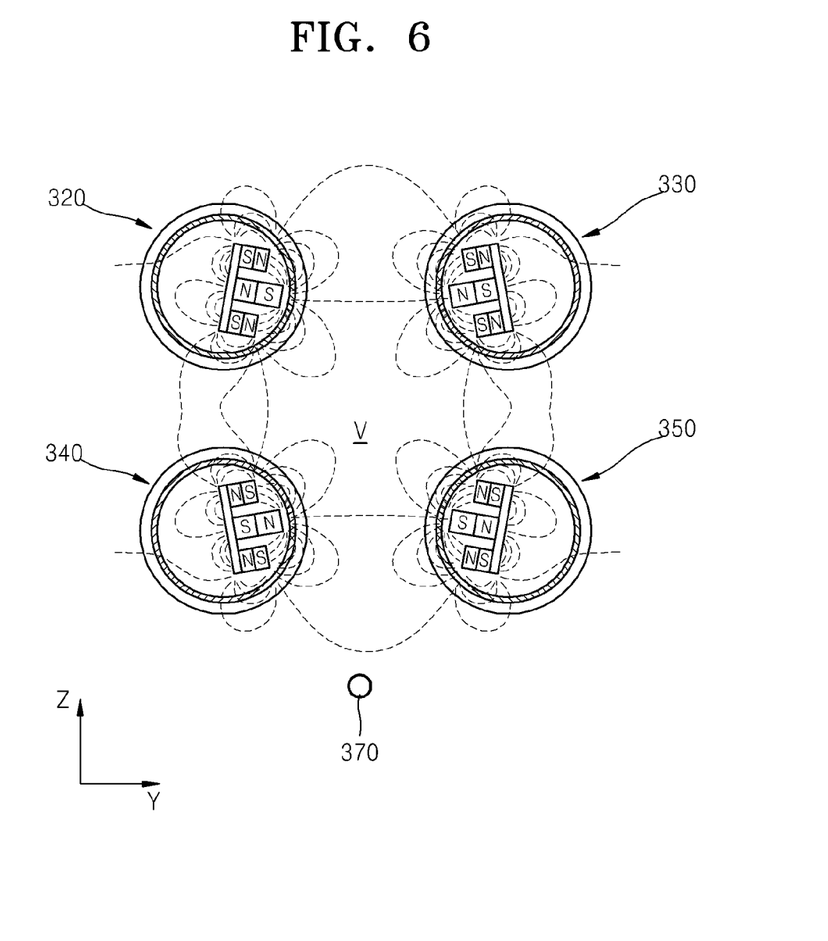
FIG. 6 is a cross-sectional schematically illustrating a magnetic flux distribution in the sputtering apparatus of FIG. 5, according to exemplary embodiments.

FIG. 5 is a perspective view of a sputtering apparatus, according to exemplary embodiments. FIG. 6 is a cross-sectional view schematically illustrating a magnetic flux distribution in the sputtering apparatus of FIG. 5.

Referring to FIGS. 5 and 6, a sputtering apparatus 300 may include a chamber 310, a first cylindrical target unit 320, a second cylindrical target unit 330, a third cylindrical target unit 340, a fourth cylindrical target unit 350, a gas supply unit 370, and a power unit 380.

The first cylindrical target unit 320 may include a first cylindrical target 321, a first backing plate 322, a first magnet unit 323, and a first magnet fixing frame 324. The first magnet unit 323 may include a first magnet member 323a and a pair of second magnet members 323b. The second cylindrical target unit 330 may include a second cylindrical target 331, a second backing plate 332, a second magnet unit 333, and a second magnet fixing frame 334. The second magnet unit 333 may include a third magnet member 333a and a pair of fourth magnet members 333b.

The third cylindrical target unit 340 may include a third cylindrical target 341, a third backing plate 342, a third magnet unit 343, and a third magnet fixing frame 344. The third magnet unit 343 may include a fifth magnet member 343a and a pair of sixth magnet members 343b. The fourth cylindrical target unit 350 may include a fourth cylindrical target 351, a fourth backing plate 352, a fourth magnet unit 353, and a fourth magnet fixing frame 354. The fourth magnet unit 353 may include a seventh magnet member 353a and a pair of eighth magnet members 353b.

The respective configurations of the chamber 310, the first cylindrical target unit 320, the second cylindrical target unit 330, the third cylindrical target unit 340, the fourth cylindrical target unit 350, the gas supply unit 370, and the power unit 380 are substantially similar to the respective configurations of the chamber 110, the first cylindrical target unit 120, the second cylindrical target unit 130, the third cylindrical target unit 140, the fourth cylindrical target unit 150, the gas supply unit 170, and the power unit 180. As such, duplicative descriptions are omitted to avoid obscuring exemplary embodiments described herein.

As seen in FIGS. 5 and 6, however, the first to fourth magnet units 323, 333, 343, and 353 may rotated towards a space V disposed between the first to fourth cylindrical target units 320, 330, 340, and 350. That is, the first magnet unit 323 may be rotated towards the fourth magnet unit 353, and the second magnet unit 333 may be rotated towards the third magnet unit 343. In this manner, the third magnet unit 343 may be rotated towards the second magnet unit 333, and the fourth magnet unit 353 may be rotated towards the first magnet unit 323.

In exemplary embodiments, the first and third magnet units 323 and 343 may be formed such that the polarity direction of the first magnet unit 323 directed toward an outer side of the first cylindrical target unit 320 is different from the polarity direction of the third magnet unit 343 directed toward an outer side of the third cylindrical target unit 340. That is, as the polarity of the first magnet member 323a, an outer portion of the first cylindrical target unit 320 may have the polarity of S and an inner portion of the first cylindrical target unit 320 may have the polarity of N. As the polarity of the pair of second magnet members 323b, respective outer portions of the first cylindrical target unit 320 may have the polarity of N and respective inner portions of the first cylindrical target unit 320 may have the polarity of S. To this end, as the polarity of the fifth magnet member 343a, an outer portion of the third cylindrical target unit 340 may have the polarity of N, and an inner portion of the third cylindrical target unit 340 may have the polarity of S. As the polarity of the pair of sixth magnet members 343b, respective outer portions of the third cylindrical target unit 340 may have the polarity of S, and respective inner portions of the third cylindrical target unit 340 may have the polarity of N.

As seen in FIG. 5, the polarity configurations of the first and fourth magnet units 323 and 253 may be similar, and the polarity configurations of the second and third magnet units may be similar. As such, duplicative descriptions are omitted to avoid obscuring exemplary embodiments described herein. Alternatively, the first and fourth magnet units 323 and 353 may be formed to have the same polarity configurations as the first and fourth magnet units 123 and 153 described in association with FIGS. 1 and 2.

However, the above description merely corresponds to one exemplary embodiment. It is contemplated, however, that exemplary embodiments may include all cases in which the first magnet unit 323 and the third magnet unit 343 have different polarities, and the first to fourth magnet units 323, 333, 343, and 353 may have the polarity configurations as described with reference to FIGS. 1 to 4.

In operation of the sputtering apparatus 300, a sputtering process may be performed after a substrate S is loaded into the chamber 310. In this manner, the substrate S may be disposed to face the first and second cylindrical target units 320 and 330.

When the loading of the substrate S is complete, the power unit 380 may apply power to the first to fourth cylindrical target units 320, 330, 340, and 350, such that the first to fourth cylindrical target units 320, 330, 340, and 350 may function as an anode or a cathode. That is, when power is provided to each of the first to fourth cylindrical target units 320, 330, 340, and 350, the first and second cylindrical target units 320 and 330 may function as a cathode, and the third and fourth cylindrical target units 340 and 350 may function as an anode. Alternatively, power may be provided to the first to fourth cylindrical target units 320, 330, 340, and 350, such that the first and second cylindrical target units 320 and 330 function as an anode, and the third and fourth cylindrical target units 340 and 350 function as a cathode. It is noted that the power unit 380 may provide AC power, such that the anode/cathode configuration of the first to fourth cylindrical target units 320, 330, 340, and 350 alternates between the two aforementioned configurations.

The method of applying power to the first to fourth cylindrical target units 320, 330, 340, and 350 may, however, be performed in any other suitable manner. For instance, the power may be applied as described with reference to FIGS. 1 and 2, such that the first to fourth cylindrical target units 320, 330, 340, and 350 function as an anode or a cathode. However, for convenience of description, exemplary embodiments are described with reference to the first and second cylindrical target units 320 and 330 functioning as cathodes, and the third and fourth cylindrical target units 340 and 350 functioning as anodes.

When power is applied to the first to fourth cylindrical target units 320, 330, 340, and 350 as described above, the first and third cylindrical target units 320 and 340 or the first and fourth cylindrical target units 320 and 350 may form a first electric field. Also, the second and third cylindrical target units 330 and 340 or the second and fourth cylindrical target units 330 and 350 may form a second electric field. Additionally, the first and second magnet units 323 and 333 may form a first magnetic field, and the third and fourth magnet units 343 and 353 may form a second magnetic field. The first magnetic field and the second magnetic field may be focused on a space V disposed between the first to fourth cylindrical target units 320, 330, 340, and 350. The first magnetic field and the second magnetic field may influence the first electric field and the second electric field to focus plasma generated via the first to fourth cylindrical target units 320, 330, 340, and 350 on the space V.

According to exemplary embodiments, while the first magnetic field, the second magnetic field, the first electric field, and the second electric field are formed as described above, the first to fourth cylindrical target units 320, 330, 340, and 350 may rotate. The gas supply unit 370 may inject the process gas G from between the third and fourth cylindrical target units 340 and 350 toward the substrate S. In this manner, the process gas G may form plasma as described above, and the formed plasma may be confined in the space V between the first to fourth cylindrical target units 320, 330, 340, and 350 by the first magnetic field, the second magnetic field, the first electric field, and the second electric field. As described above, the plasma does not directly arrive at the substrate S due to the presence of the first magnetic field, the second magnetic field, the first electric field, and the second electric field, but, instead, may arrive at the substrate S due to diffusion of the process gas G.

In exemplary embodiments, since the first magnetic field is formed substantially perpendicular to the first electric field, and the second magnetic field is formed substantially perpendicular to the second electric field, the sputtering apparatus 300 may increase discharge effects between the first and third cylindrical target units 320 and 340, and between the second and fourth cylindrical target units 330 and 350. Further, because the sputtering apparatus 300 may confine plasma in the space V between the first to fourth cylindrical target units 320, 330, 340, and 350, substrate damage that may otherwise be generated when plasma is directly accelerated and arrives at the substrate S may be minimized (or otherwise reduced). In other words, the plasma may arrive at the substrate S in a relatively low energy state versus a relatively high energy state.

Figure 7:
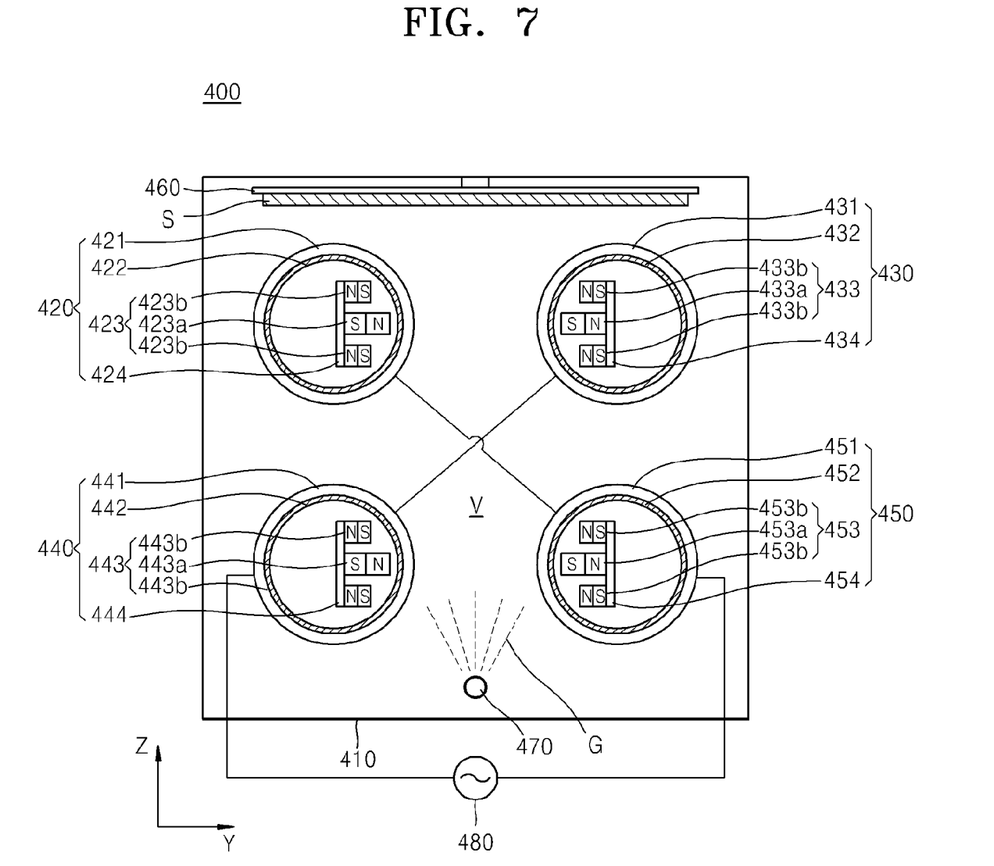
FIG. 7 is a cross-sectional view of a sputtering apparatus, according to exemplary embodiments.

FIG. 7 is a perspective view of a sputtering apparatus, according to exemplary embodiments.

Referring to FIG. 7, the sputtering apparatus 400 may include a chamber 410, a first cylindrical target unit 420, a second cylindrical target unit 430, a third cylindrical target unit 440, a fourth cylindrical target unit 450, a gas supply unit 470, and a power unit 480.

The first cylindrical target unit 420 may include a first cylindrical target 421, a first backing plate 422, a first magnet unit 423, and a first magnet fixing frame 424. The first magnet unit 423 may include a first magnet member 423a and a pair of second magnet members 423b. The second cylindrical target unit 430 may include a second cylindrical target 431, a second backing plate 432, a second magnet unit 433, and a second magnet fixing frame 434. The second magnet unit 433 may include a third magnet member 433a and a pair of fourth magnet members 433b.

The third cylindrical target unit 440 may include a third cylindrical target 441, a third backing plate 442, a third magnet unit 443, and a third magnet fixing frame 444. The third magnet unit 443 may include a fifth magnet member 443a and a pair of sixth magnet members 443b. The fourth cylindrical target unit 450 may include a fourth cylindrical target 451, a fourth backing plate 452, a fourth magnet unit 453, and a fourth magnet fixing frame 454. The fourth magnet unit 453 may include a seventh magnet member 453a and a pair of eighth magnet members 453b.

The respective configurations of the chamber 410, the first cylindrical target unit 420, the second cylindrical target unit 430, the third cylindrical target unit 440, the fourth cylindrical target unit 450, the gas supply unit 470, and the power unit 480 are substantially similar to the chamber 110, the first cylindrical target unit 120, the second cylindrical target unit 130, the third cylindrical target unit 140, the fourth cylindrical target unit 150, the gas supply unit 170, and the power unit 180. As such, duplicative descriptions are omitted to avoid obscuring exemplary embodiments described herein.

In operation of the sputtering apparatus 400, a sputtering process may be performed after a substrate S is loaded into the chamber 410. In this manner, the substrate S may be disposed to face the first and second cylindrical target units 420 and 430.

When the loading of the substrate S is complete, the power unit 480 may apply power to the first to fourth cylindrical target units 420, 430, 440, and 450, such that the first to fourth cylindrical target units 420, 430, 440, and 450 may function as an anode or a cathode. That is, when power is provided to each of the first to fourth cylindrical target units 420, 430, 440, and 450, the first and fourth cylindrical target units 420 and 450 may function as a cathode, and the second and third cylindrical target units 430 may function as an anode. Alternatively, power may be provided to the first to fourth cylindrical target units 420, 430, 440, and 450, such that the first and fourth cylindrical target units 420 and 450 function as an anode, and the second and third cylindrical target units 430 and 440 function as a cathode. It is noted that the power unit 480 may provide AC power, such that the anode/cathode configuration of the first to fourth cylindrical target units 420, 430, 440, and 450 alternates between the two aforementioned configurations.

When power is applied to the first to fourth cylindrical target units 420, 430, 440, and 450 as described above, a first magnetic field formed by the first and second magnet units 423 and 433 and a first electric field formed by the first and third cylindrical target units 420 and 440 may be formed at a determined angle with respect to one another. Moreover, a second magnetic field formed by the third and fourth magnet units 443 and 453, and a second electric field formed by the second and first cylindrical target units 430 and 420 or the second and fourth cylindrical target units 430 and 450 may be formed at a determined angle with respect to one another.

According to exemplary embodiments, while the first magnetic field, the second magnetic field, the first electric field, and the second electric field are formed as above, the first to fourth cylindrical target units 420, 430, 440, and 450 may rotate. The gas supply unit 470 may inject the process gas G from between the third and fourth cylindrical target units 440 and 450 toward the substrate S. In this manner, the process gas G may form plasma as described above, and the formed plasma may be confined in the space V between the first to fourth cylindrical target units 420, 430, 440, and 450 by the first magnetic field, the second magnetic field, the first electric field, and the second electric field. As described above, the plasma does not directly arrive at the substrate S due to the presence of the first magnetic field, the second magnetic field, the first electric field, and the second electric field, but, instead, may arrive at the substrate S due to diffusion of the process gas G.

In exemplary embodiments, since the first magnetic field is formed substantially perpendicular to the first electric field, and the second magnetic field is formed substantially perpendicular to the second electric field, the sputtering apparatus 400 may increase discharge effects between the first and third cylindrical target units 420 and 440, and between the second and fourth cylindrical target units 430 and 450. Further, because the sputtering apparatus 400 may confine plasma in the space V between the first to fourth cylindrical target units 420, 430, 440, and 450, substrate damage that may otherwise be generated when plasma is directly accelerated and arrives at the substrate S may be minimized (or otherwise reduced). In other words, the plasma may arrive at the substrate S in a relatively low energy state versus a relatively high energy state.

According to exemplary embodiments, plasma may be confirmed in a space between the first to fourth cylindrical target units to minimize damage of a substrate that may otherwise occur when plasma is directly accelerated and arrives at the substrate. As such, the plasma may arrive at the substrate S in a relatively low energy state versus a relatively high energy state.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A sputtering method, comprising:
   providing power to at least one pair of a plurality of pairs of cylindrical target units, each of the cylindrical target units being spaced apart from one another and arranged facing one another; and
   providing a sputtering gas in a region between the plurality of pairs of cylindrical target units,
   wherein the plurality of pairs of cylindrical target units is disposed in a chamber configured to support a substrate therein,
   wherein each of the plurality of pairs of cylindrical target units is positioned at a same side of the substrate as one another, the plurality of pairs of cylindrical target units comprising a first pair of cylindrical target units overlapping a second pair of cylindrical target units in a direction normal to the same side of the substrate, and
   wherein the provision of power causes, at least in part, each pair of cylindrical target units to comprise a first cylindrical target unit functioning as an anode electrode and a second cylindrical target unit functioning as a cathode electrode.

2. The sputtering method of claim 1, wherein the chamber and the substrate are electrically floated.

3. The sputtering method of claim 1, wherein the plurality of pairs of cylindrical target units are arranged at least in a rectangular configuration.

4. The sputtering method of claim 1, wherein the power is alternating current (AC) power.

5. The sputtering method of claim 1, wherein:
   each of the cylindrical target units comprises a magnet unit disposed therein; and
   among the magnet units, polarities of two magnet units facing each other are different.

* * * * *